United States Patent
Shinozaki

(10) Patent No.: US 7,706,186 B2
(45) Date of Patent: Apr. 27, 2010

(54) CONTROLLING A SEMICONDUCTOR DEVICE

(75) Inventor: Naoharu Shinozaki, Kangawa (JP)

(73) Assignee: Spanion LLC, Sunnyvale, CA (US)

( * ) Notice: Subject to any disclaimer, the term of this patent is extended or adjusted under 35 U.S.C. 154(b) by 140 days.

(21) Appl. No.: 11/982,864

(22) Filed: Nov. 5, 2007

(65) Prior Publication Data

US 2008/0140880 A1    Jun. 12, 2008

Related U.S. Application Data

(60) Provisional application No. 60/856,545, filed on Nov. 3, 2006.

(30) Foreign Application Priority Data

Mar. 6, 2007    (JP)    ............... 2007-055322

(51) Int. Cl.
  *G11C 16/04*    (2006.01)
(52) U.S. Cl. ............... 365/185.17; 365/185.29; 365/185.33
(58) Field of Classification Search ............ 365/185.17, 365/185.29, 185.33
  See application file for complete search history.

(56) References Cited

U.S. PATENT DOCUMENTS

| | | | |
|---|---|---|---|
| 5,742,787 A | 4/1998 | Talreja | |
| 6,201,739 B1 | 3/2001 | Brown et al. | |
| 6,633,950 B1 * | 10/2003 | Brown et al. | ............... 711/103 |
| 2005/0002240 A1 * | 1/2005 | Hamaguchi et al. | .... 365/185.33 |
| 2005/0057997 A1 | 3/2005 | Mitani | |
| 2005/0248993 A1 | 11/2005 | Lee et al. | |

FOREIGN PATENT DOCUMENTS

| | | |
|---|---|---|
| EP | 1345236 A1 | 3/2002 |
| EP | 1345236 A | 9/2003 |
| JP | 2004-30438 A | 1/2004 |

* cited by examiner

*Primary Examiner*—Hoai V Ho

(57) ABSTRACT

A semiconductor device and a control method thereof that include a memory cell array having a plurality of nonvolatile memory cells and a control circuit. The control circuit starts a first operation of the memory cells in a part of the region of the memory cell array when a first command is input, then decides whether to temporarily suspend the first operation or to reset the first operation when a second command is input, and temporarily suspends the first operation if the control circuit decides to temporarily suspend the first operation, and terminates the first operation if the control circuit decides to reset the first operation.

19 Claims, 12 Drawing Sheets

CONTROLLING A SEMICONDUCTOR DEVICE

CLAIM OF PRIORITY

This is a continuation-in-part application of Japanese Patent Application No. JP2007/055322, filed Mar. 6, 2007. This patent application claims the benefit of the co-pending U.S. Provisional Patent Application No. 60/856,545 entitled "Erasure Suspension Feature", by Naoharu Shinozaki, filed Nov. 3, 2006; the disclosure of which is hereby incorporated by reference.

BACKGROUND

In recent years, nonvolatile memory, which is a semiconductor device that can rewrite data, has been widely used for many electronic devices such as mobile phone and digital cameras. A flash memory, which is a typical nonvolatile memory, includes a NOR-type flash memory and a NAND-type flash memory. The NOR-type flash memory is used to process a small amount of data such as a program at high speed, and the NAND-type flash memory is used to process a large amount of data such as an image.

Such nonvolatile memory can write data (writing operation) to a memory cell by accumulating charges (for example, electrons) to a charge accumulation layer of a transistor that forms the memory cell. The data of the memory cell at this time is set to "1". Also, by erasing the charges from the charge accumulation layer, the data of the memory cell can be erased (erasing operation). The data of the memory cell at this time is set to "0". The state of the charge at the charge accumulation layer can be detected by current and the data of the memory cell can be read out (reading operation) whether it is "0" or "1". For example, a large amount of data may be erased all at once, for example, when data is erased in a unit of block. In this case, a considerable time is required for the erasing operation from start to end. Accordingly, when the erasing operation, the writing operation, or the reading operation is performed on a large amount of data, it takes a long time from the start of the operation to the end. Also, when miniaturization is advanced to realize high-capacity, operation time for writing and erasing tends to slow down. Thus, an improvement of some sort has been called for. Japanese Patent Application Publication No. JP-A-2004-30438 and U.S. Patent Application Publication No. 2005/0248993 disclose a technology of temporarily suspending an erasing operation, when a suspend command is input from an external circuit during the erasing operation.

However, when a suspend command is added anew, a new command needs to be added to the external circuit. In a system using an existing flash memory, commands that an external circuit (controller) handles for controlling flash memory are almost the same. As a result, it is difficult to add a new command.

SUMMARY

An embodiment of the invention can include controlling a semiconductor device that can realize a function of temporarily suspending erasing, writing, reading or the like (e.g., a first operation) without increasing the number of commands that are handled by an external circuit.

In one embodiment, a semiconductor device can include a memory cell array having a plurality of nonvolatile memory cells and a control circuit. The control circuit can start a first operation of the memory cells in a part of a region of the memory cell array when a first command is input. Then, the control circuit can decide whether to temporarily suspend the first operation or to reset the first operation when a second command is input. Further, the control circuit can temporarily suspend the first operation when the control circuit decides to temporarily suspend it, and can terminate the first operation when the control circuit decides to reset it. In an embodiment, since the second command can be used as a command to temporarily suspend or to reset the first operation, the first operation can be temporarily suspended without adding a command. Also, by allocating the temporary suspension and the reset to the same command, the control can be simplified.

In the above configuration, after the first command is input, the control circuit may decide to reset the first operation when the second command is input before a predetermined time has passed, and to temporarily suspend the first operation when the second command is input after the predetermined time has passed. With this configuration, the control circuit can easily decide whether to temporarily suspend or to reset the first operation.

In the above configuration, the control circuit may restart the first operation when the first command is input after the first operation is temporarily suspended. With this configuration, since the first operation can be restarted using the first command, the first operation can be restarted without adding a command.

In one embodiment, the semiconductor device may also include a memory unit that can store, as a storing address, an internal address of the memory cell array that can perform the next first operation when the control circuit temporarily suspends the first operation, and can output the storing address as an internal address to restart erasing when the first operation is restarted. With this configuration, the first operation can be restarted continuously from an address at a point of the temporary suspension, since an address latch circuit can store the address when the first operation is temporarily suspended, and the stored address can be used when the first operation is restarted.

In the above configuration, the control circuit may terminate the first operation when the second command is input before a predetermined time has passed after the first operation is temporarily suspended. With this configuration, the first operation can be terminated even while the first operation is temporarily suspended.

In the above configuration, the control circuit may disable the second command when the second command is input after the predetermined time has passed after the first operation is temporarily suspended.

In the above configuration, the memory cell array may be a NAND-type memory cell array. The NAND-type memory cell array can collectively erase the memory cells in the memory cell array in a unit of a block. Therefore, by temporarily suspending the first operation during the first operation, it is possible to further increase the operation speed.

A method of a semiconductor device that can include a memory cell array having a plurality of nonvolatile memory cells according to another embodiment of the invention can include: starting a first operation of the memory cells in a part of a region of the memory cell array when a first command is input; when a second command is input thereafter, deciding whether to temporarily suspend or to reset the first operation; and temporarily suspending the first operation if the method decides to temporarily suspend the first operation, and terminating the first operation if the method decides to reset the first operation. According to this embodiment of the invention, the first operation can be temporarily suspended without adding a command.

In the above method, the deciding whether to temporarily suspend the first operation or to reset the first operation may be deciding, after the first command is input, to reset the first operation when the second command is input before a predetermine time has passed, and to temporarily suspend the first operation when the second command is input after the predetermined time has passed. With this configuration, the temporary suspension and the reset can be easily decided.

According to various embodiments of the invention, since the second command can be used as a command to temporarily suspend or to reset the first operation, the first operation can be temporarily suspended without adding a command. Also, by allocating the temporary suspension and the reset to the same command, the control can be simplified.

In an embodiment in accordance with the invention, a semiconductor device comprising a memory cell array including a plurality of nonvolatile memory cells; and a control circuit coupled to the memory cell array, the control circuit for starting a first operation of the memory cell array when a first command is input, the control circuit for deciding whether to temporarily suspend the first operation or to reset the first operation when a second command is input, the control circuit for temporarily suspending the first operation and for resetting the first operation.

In one embodiment in accordance with the invention, a method for a semiconductor device that includes a memory cell array having a plurality of nonvolatile memory cells, the method comprising: starting a first operation of the memory cell array when a first command is input; and when a second command is input thereafter, deciding whether to temporarily suspend the first operation or to reset the first operation.

In an embodiment in accordance with the invention, a wireless communications device, comprising: a processor; a communications component coupled to the processor; a transmitter coupled to the processor; a receiver; an antenna coupled to the transmitter circuit and the receiver circuit; and a memory coupled to the processor, the memory comprising: a memory cell array including a plurality of nonvolatile memory cells; and a control circuit coupled to the memory cell array, the control circuit for starting a first operation of the memory cell array when a first command is input, the control circuit for deciding whether to temporarily suspend the first operation or to reset the first operation when a second command is input, the control circuit for temporarily suspending the first operation and for resetting the first operation.

While particular embodiments of the invention have been specifically described within this summary, it is noted that the invention is not limited to these embodiments. The invention is intended to cover alternatives, modifications and equivalents, which may be included within the scope of the invention as construed according to the Claims.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
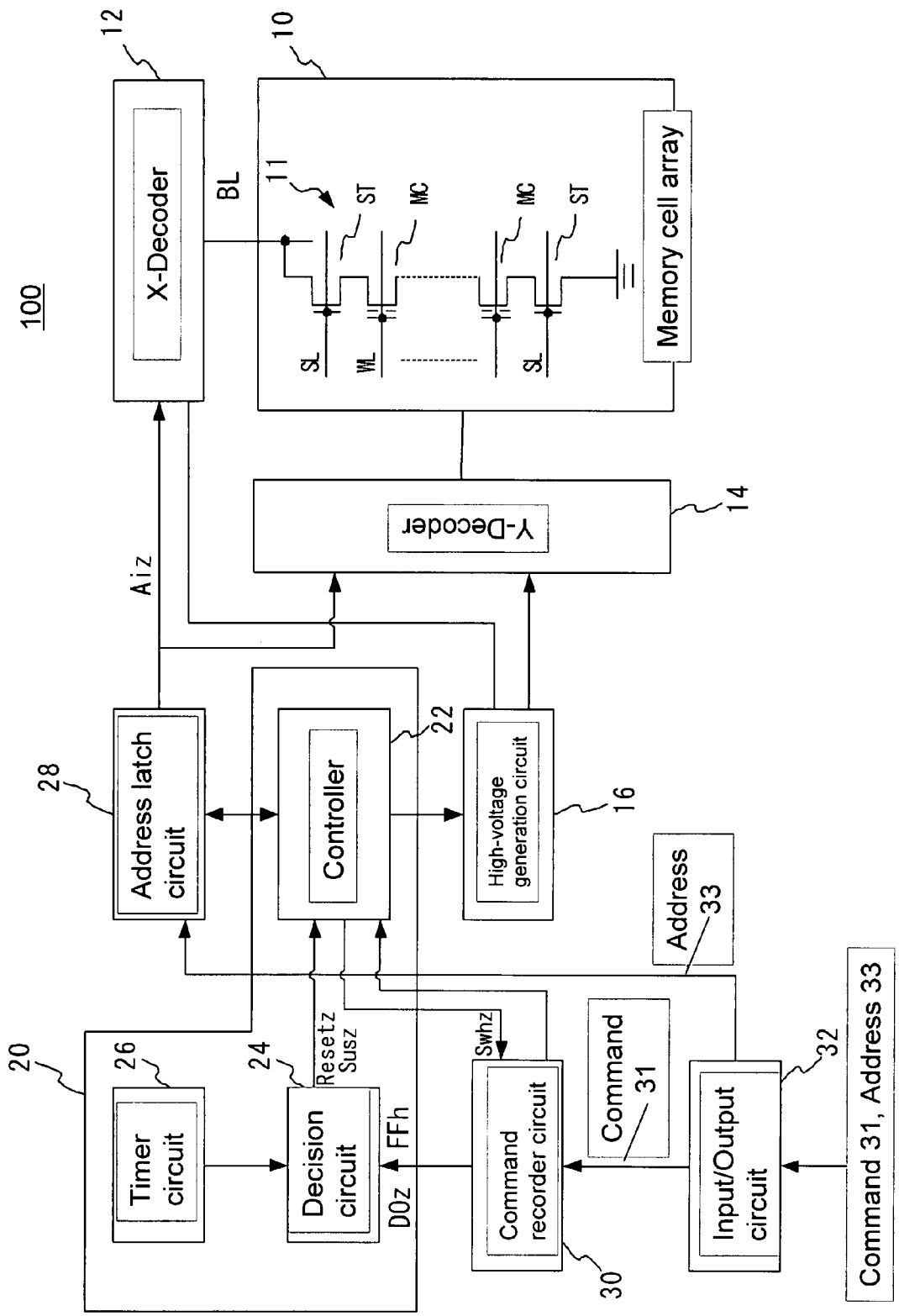
FIG. 1 is a block diagram of a semiconductor device in accordance with an embodiment of the invention.

The following illustrates an example in accordance with an embodiment of the invention in which an erasing operation can be temporarily suspended in a NAND-type flash memory. FIG. 1 is a block diagram of an exemplary flash memory 100 in accordance with an embodiment of the invention. It is noted that in an embodiment, flash memory 100 can be implemented as, but is not limited to, a semiconductor device. A memory cell array 10 can be arranged with a string 11 that can be formed of selection transistors ST and nonvolatile memory cells MC. A bit line BL that is coupled to the string 11 can be coupled to an X-decoder 12. At gates of the selection transistors ST and the memory cells MC, selection lines SL and word lines WL can be respectively coupled. The selection lines SL and the word lines WL can be coupled to a Y-decoder 14. The X-decoder 12 and the Y-decoder 14 designate an address within the memory cell array 10 by an internal address Aiz, and can perform writing, erasing, or reading to and from the memory cells MC of the designated address.

When a command 31 is input into an input/output circuit 32 from an external circuit, the input/output circuit 32 can output the command 31 to a command recorder circuit 30. The command recorder circuit 30 can decode the command 31, and if the command 31 is D0$h$ or FFh, can output the command 31 to a decision circuit 24. If the command 31 is other than D0$h$ or FFh, the command 31 can be directly output to a controller 22. Or, the command 31 can output to the controller 22 by passing through the decision circuit 24. A timer circuit 26 can be coupled to the decision circuit 24. Depending on the output of the timer circuit 26, a reset signal Resetz or a suspend signal Susz can be output to the controller 22. The controller 22 can output a switching signal Swhz to the command recorder circuit 30.

When address data 33 is input to the input/output circuit 32 from the external circuit, the input/output circuit 32 can output the address data 33 to an address latch circuit 28. The address latch circuit 28 can directly output the address data 33 to the X-decoder 12 and the Y-decoder 14 as the internal address Aiz. Or, the address data 33 stored in the address latch circuit 28 can be output to the X-decoder 12 and the Y-decoder 14 as the internal address Aiz.

Responsive to the input command 31, the controller 22 can cause a high voltage generation circuit 16 to generate a high voltage to perform operations of writing and erasing data of the memory cells MC of the memory cell array 10. The high voltage can be applied to the memory cell array 10 via the X-decoder 12 and the Y-decoder 14. Accordingly, the data can be written to or erased from the memory cells MC selected by the internal address Aiz. The controller 22, the decision circuit 24, and the timer circuit 26 can form an erase control circuit 20 (which can be referred to as a control circuit).

Figure 2:
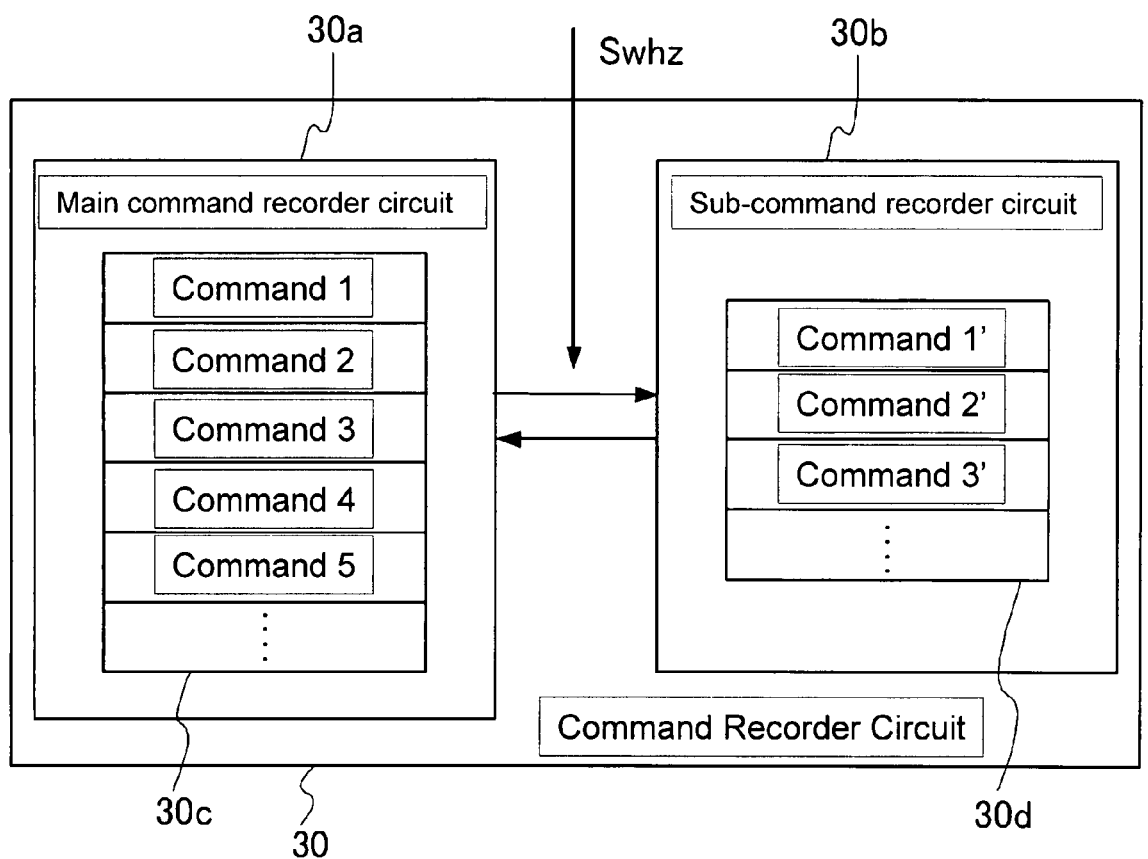
FIG. 2 is a block diagram of a command recorder circuit in accordance with various embodiments of the invention.

FIG. 2 is a block diagram of an embodiment of the command recorder circuit 30 in accordance with the invention. The command recorder circuit 30 can include, but is not limited to, a main command recorder circuit 30a and a sub-command recorder circuit 30b. The main command recorder circuit 30a can include a first command table 30c and the sub-command recorder circuit 30b can include a second command table 30d. In the command recorder circuit 30, when the switching signal Swhz is at a low level, the main command recorder circuit 30a can decode a command (e.g., commands 1 through 5, etc.) using the first command table 30c. Meanwhile, when the switching signal Swhz is at a high level, the sub-command recorder circuit 30b can decode a command (e.g., commands 1' through 3', etc.) using the second command table 30d. At the first command table 30c, FFh can be decoded into a command for performing reset (e.g., reset command), and at the second command table 30d, FFh can be decoded into a command for performing temporary suspension (e.g., suspend command).

Figure 3:
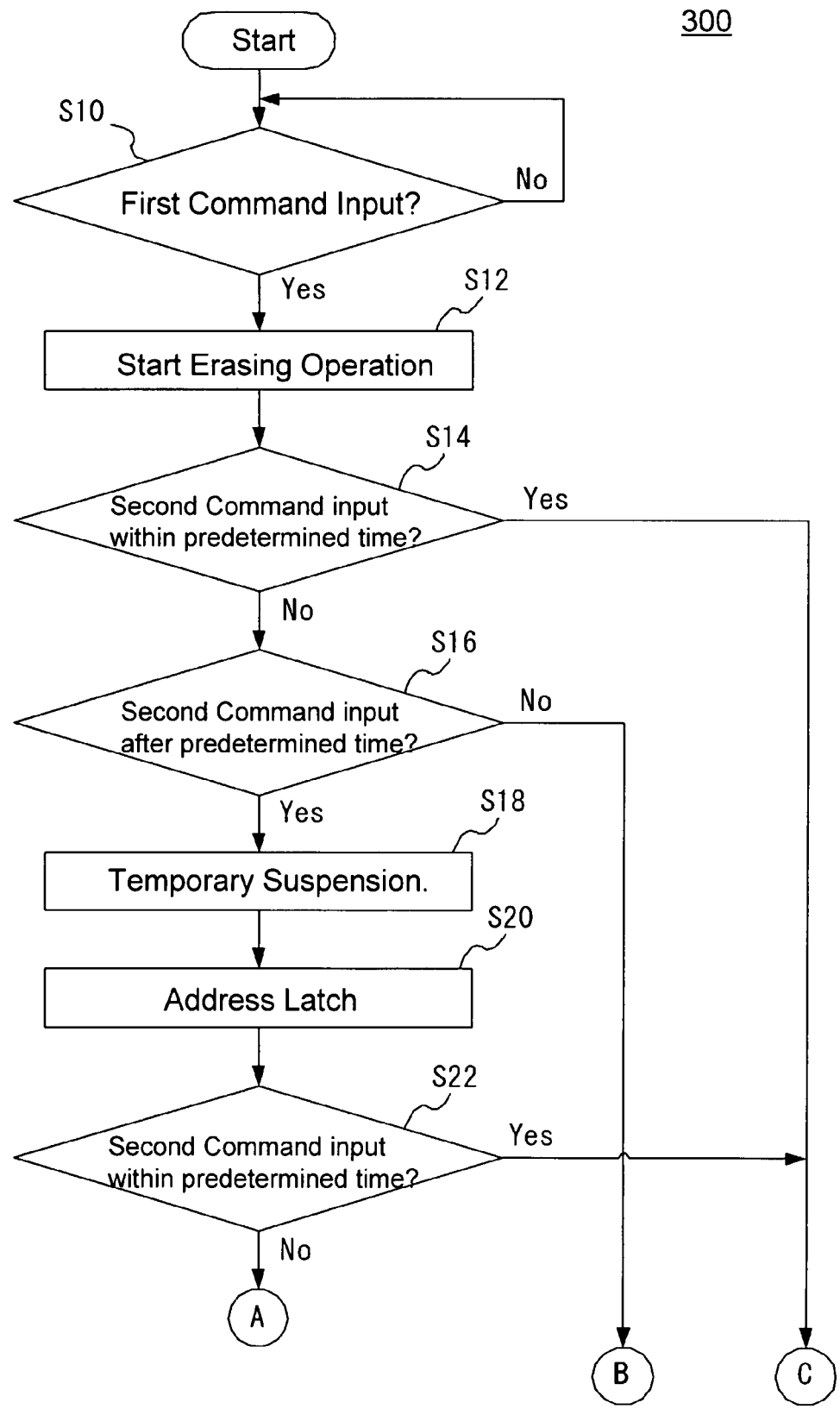
FIGS. 3 and 4 are a flow diagram showing a method of an erase control circuit in accordance with an embodiment of the invention.
Figure 4:
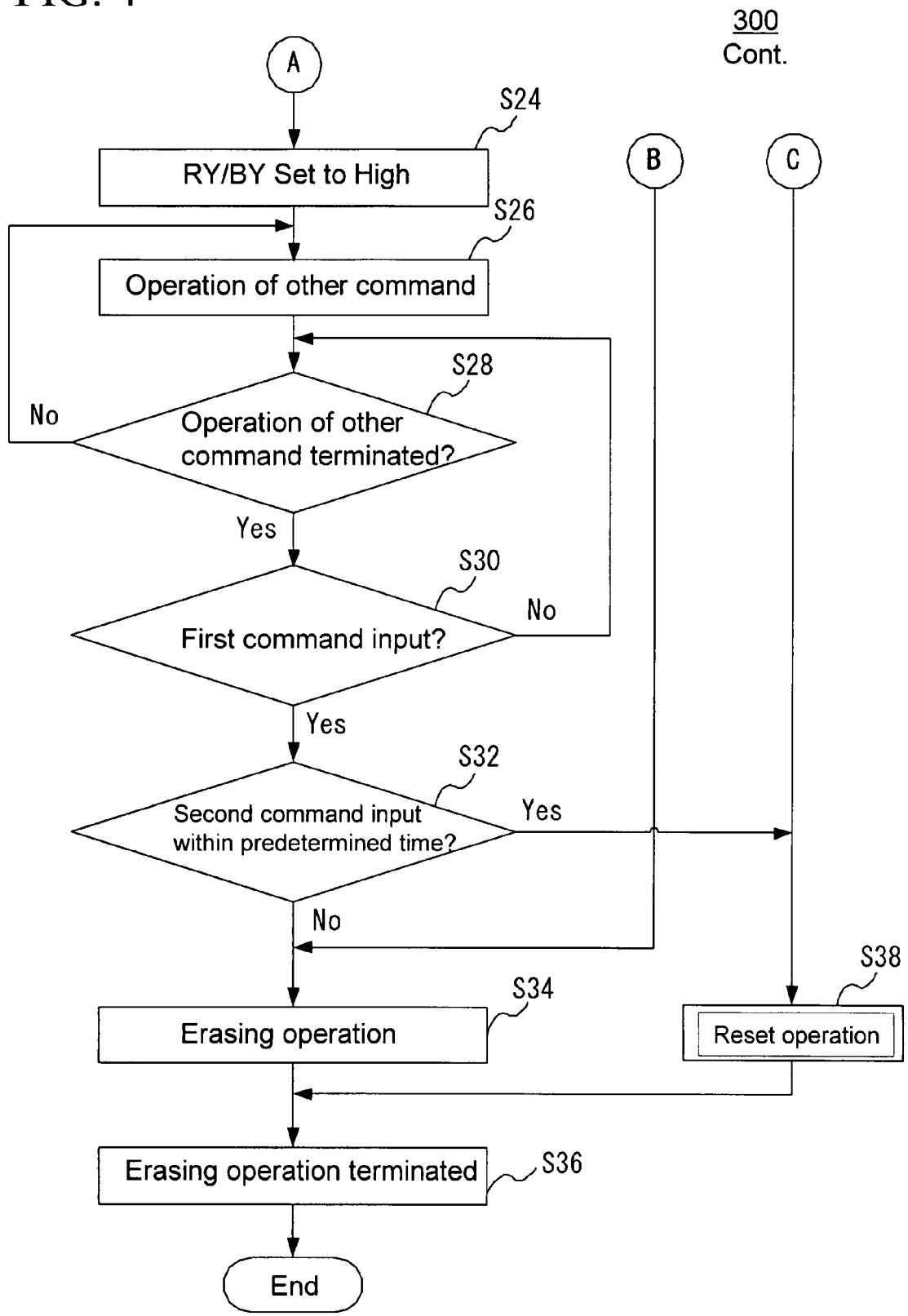

Referring to FIGS. 3 through 8, an operation of the flash memory (e.g., 100) will be explained in accordance with various embodiments of the invention. FIGS. 3 and 4 are a flow diagram showing a method 300 or process of an erase control circuit during erasing operation in accordance with various embodiments of the invention, while FIGS. 5 through 8 are timing charts in accordance with various embodiments of the invention. In FIGS. 5 through 8, commands 60h and D0h can be commands to start an erasing operation. An address Add can be a block address, which can be an address of a plurality of blocks. When the commands 60h and D0h are input, the controller 22 can erase data of the plurality of blocks corresponding to the address Add of memory cell array 10. Also, as hereinafter described, when the commands 60h and D0h are input while the erasing operation is temporarily suspended, the controller 22 can restart the erasing operation. It is noted that in an embodiment, the command FFh can be a command to perform reset or temporary suspension.

In an embodiment, a ready/busy signal RY/BY can be a signal showing whether the memory cell array 10 is in a busy state to the external circuit. When the controller 22 is performing the erasing, the writing, or the reading operation, the ready/busy signal RY/BY can become a low level and indicate that it is in a busy state. When the reset signal Resetz becomes a high level, the controller 22 can terminate the erasing or the writing operation. When the suspend signal Susz becomes a high level, the controller 22 can temporarily suspend the erasing operation.

Figure 5:
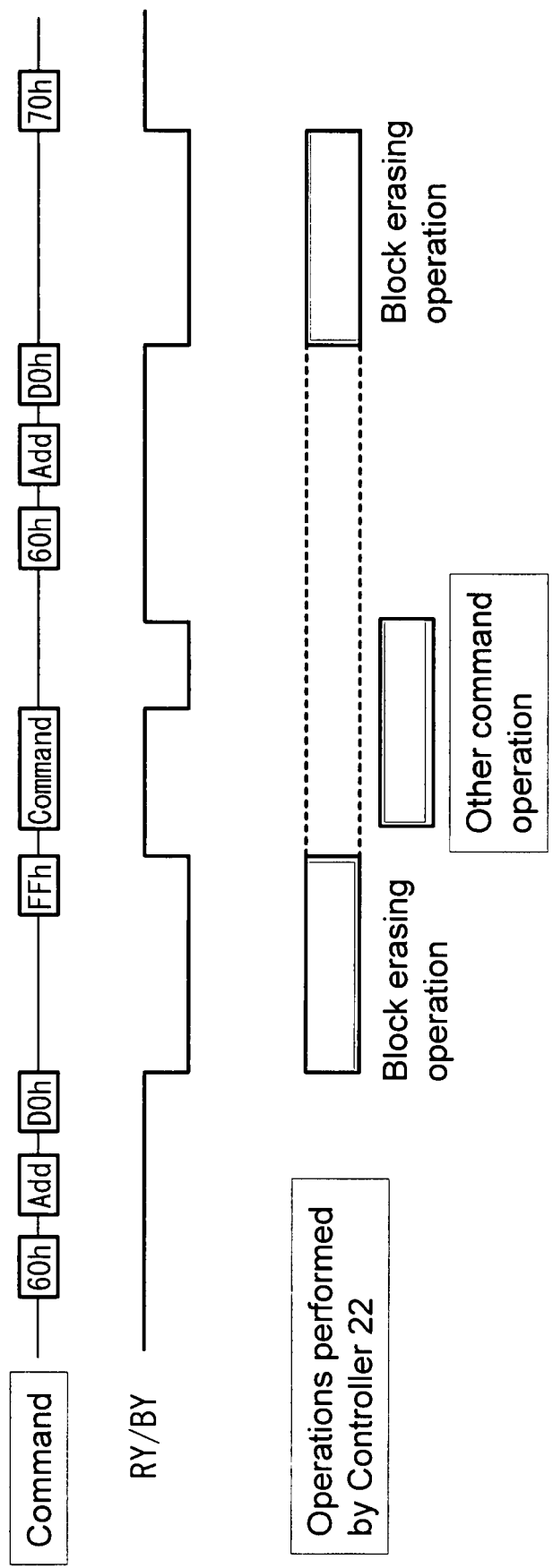
FIG. 5 is a timing chart in accordance with an embodiment of the invention.

With reference to FIG. 3, when the switching signal Swhz is at a low level, the main command recorder circuit 30a in the command recorder circuit 30 can decode the command, using the first command table 30c. The erase control circuit 20 can wait until the first command D0h is input (operation S10). With reference to FIG. 5, the command 60h, the address Add, and the command D0h can be input in the input/output circuit 32. With reference to FIG. 1, the commands 60h and D0h can be output to the command recorder circuit 30, and the address Add can be output to the address latch circuit 28. The command recorder circuit 30 can output the commands 60h and D0h to the controller 22. With reference to FIG. 3, because the first command D0h is input to the controller 22, the controller 22 can start the erasing operation (operation S12). With reference to FIG. 5, the ready/busy signal RY/BY can become a low level. The decision circuit 24 can cause the timer circuit 26 to start a timer. The timer circuit 26 can output a high or low level to the decision circuit 24 depending on whether a predetermined time (for example, 1 μs) has passed since the start of the timer.

Figure 6:
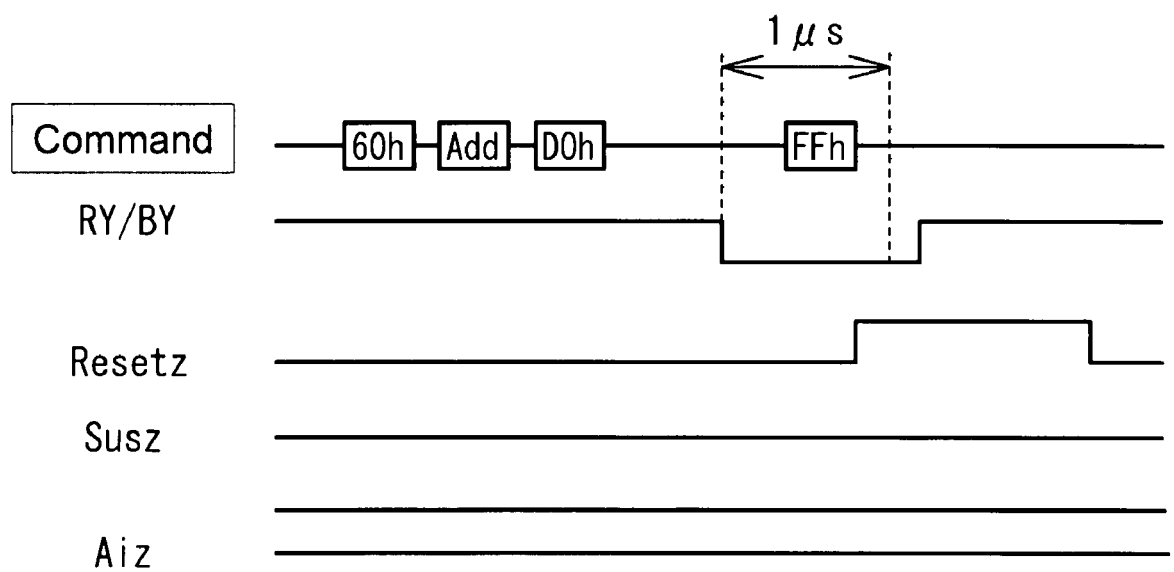
FIG. 6 is another timing chart in accordance with an embodiment of the invention.

With reference to FIG. 3, the decision circuit 24 can decide whether the second command FFh is input within a predetermined time (for example, 1 μs) (operation S14). FIG. 6 is a case in accordance with an embodiment where the second command FFh is input within the predetermined time (e.g., 1 μs) after the first command D0h is input and the ready/busy signal RY/BY becomes a low level. The main command recorder circuit 30a can decode the second command FFh as a reset command. The decision circuit 24 can set the reset signal Resetz to a high level. In other words, with reference to FIG. 3, it is decided "Yes" at operation S14. Accordingly, with reference to FIG. 4, the controller 22 can reset the erasing operation (operation S38) and terminate the erasing operation (operation S36). At this time, the suspend signal Susz and the internal address Aiz do not change.

Figure 7:
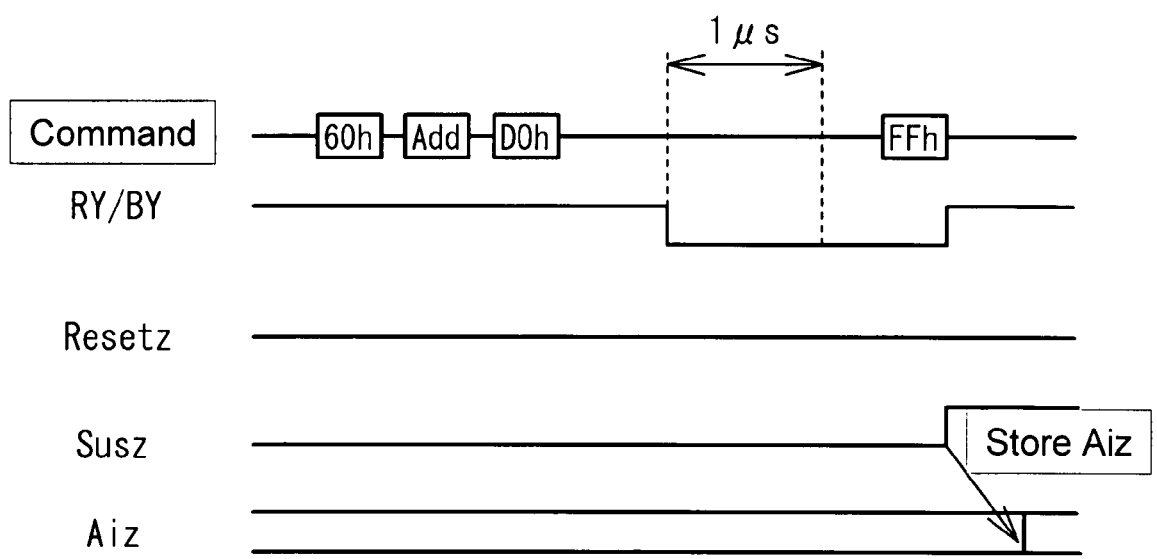
FIG. 7 is yet another timing chart in accordance with an embodiment of the invention.

With reference to FIG. 3, if it is "No" at operation S14, the decision circuit 24 can decide whether the second command FFh is input after a predetermined time (for example, 1 μs) has passed (operation S16). When a predetermined time has passed, the controller 22 can set the switching signal Swhz to a high level. Accordingly, the sub-command recorder circuit 30b in the command recorder circuit 30 can decode the command using the second command table 30d. FIGS. 5 and 7 also show a case in accordance with various embodiments where the second command FFh is input after a predetermined time (for example, 1 μs) has passed, after the first command D0h is input and the ready/busy signal RY/BY becomes a low level. The sub-command recorder circuit 30b can decode the second command FFh as a suspend command. The decision circuit 24 can set the suspend signal Susz to a high level. In other words, with reference to FIG. 3, it is decided "Yes" at operation S16. Accordingly, the controller 22 can temporarily suspend the erasing operation (operation S18). The controller 22 can set the ready/busy signal RY/BY to a high level. With reference to FIGS. 3 and 7, the controller 22 can store the internal address Aiz of the block, which can continuously perform the next erasing operation, as the storing address in the address latch circuit 28 (operation S20). Further, the decision circuit 24 can cause the timer circuit 26 to start the timer. At this time, the reset signal Resetz and the internal address Aiz do not change. The controller 22 can set the switching signal Swhz to a low level. With reference to FIG. 3, if it is "No" at operation S16, in other words, when the second command FFh is not input, with reference to FIG. 4, the erasing operation can be continued (operation S34).

Figure 8:
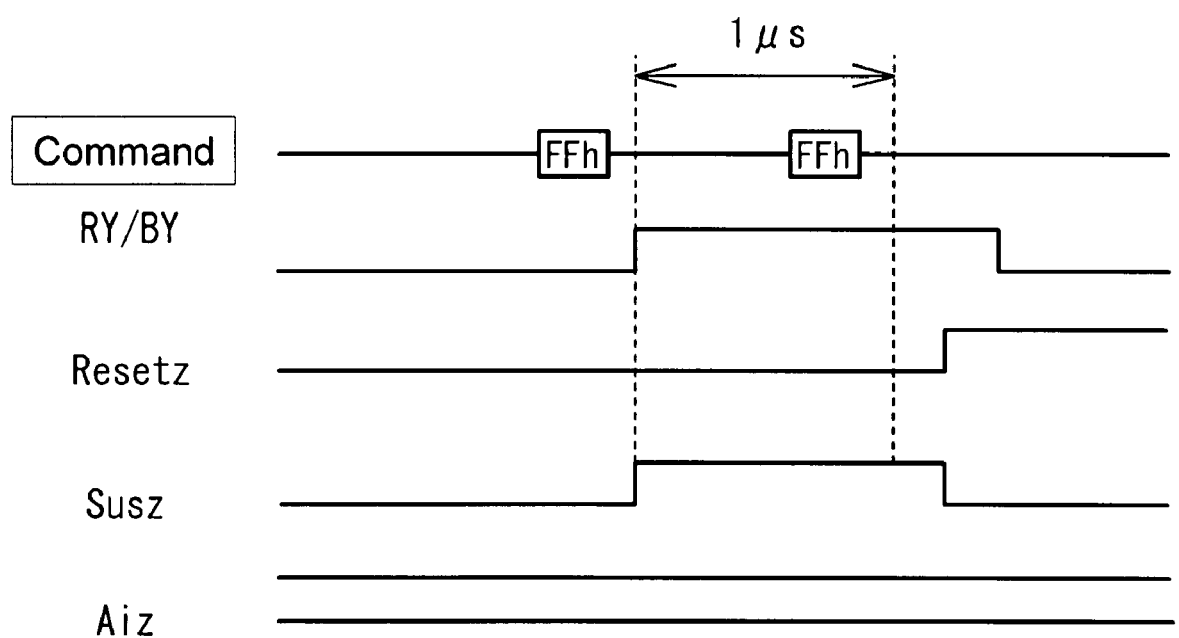
FIG. 8 is still another timing chart in accordance with an embodiment of the invention.

With reference to FIG. 3, the decision circuit 24 can decide whether the second command FFh is input again within a predetermined time (for example, 1 μs), after the second command FFh is input and the temporary suspension has started (when the suspend signal Susz becomes a high level) (operation S22). If it is "Yes", the main command recorder circuit 30a can decode the second command FFh as a reset command. With reference to FIG. 4, the controller 22 can reset the erasing operation (operation S38) and terminate the erasing operation (operation S36). With reference to FIG. 8, when the second command FFh is input within a predetermined time (e.g., 1 μs), after the second command FFh is input and the suspend signal Susz becomes high level, the decision circuit 24 can set the suspend signal Susz to a low level and the reset signal Resetz to a high level. In other words, with reference to FIG. 3, it is decided "Yes" at operation S22. With reference to FIG. 4, the controller 22 can stop the temporary suspension, reset the erasing operation (operation S38), and terminate the erasing operation (operation S36).

With reference to FIG. 3, if it is "No" at operation S22, with reference to FIGS. 5 and 7, the ready/busy signal RY/BY can be set to a high level (operation S24 of FIG. 4). Accordingly, the external circuit can recognize that the memory cell array 10 is accessible. With reference to FIG. 4, the controller 22 can perform other command operation (operation S26). The controller 22 can decide whether the other command operation is terminated (operation S28). If it is "No", the process returns to operation S26, and the other command operation is continued. With reference to FIG. 5, when the other command "Command", is input, the other command operation can be performed. With reference to FIG. 4, if it is "Yes" at operation S28, the other command operation can be terminated.

With reference to FIG. 4, the erase control circuit 20 can wait until the first command D0h is input (operation S30). When the first command D0h is input, the decision circuit 24 can decide whether the second command FFh is input within a predetermined time (operation S32). If it is "Yes", the controller 22 can reset the erasing operation (operation S38) and terminate the erasing operation (operation S36).

Figure 9:
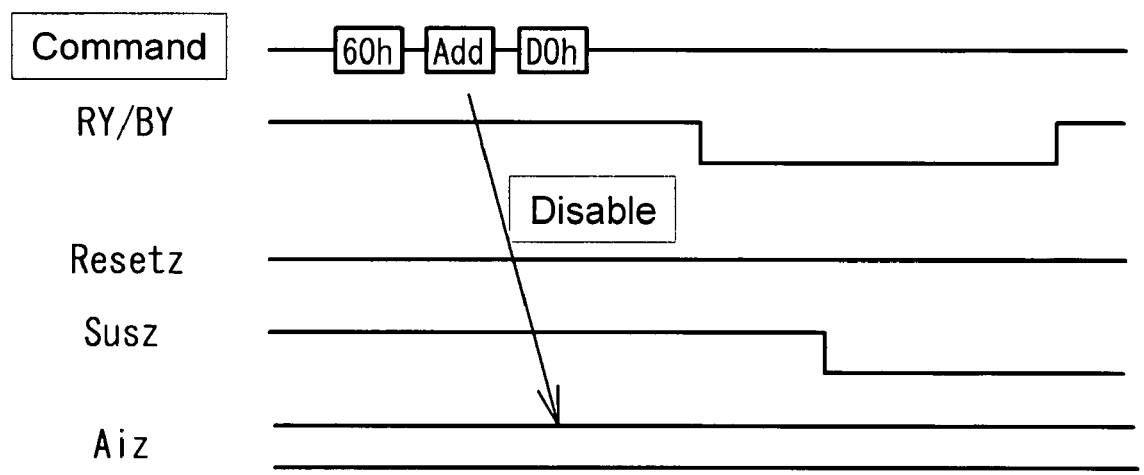
FIG. 9 is another timing chart in accordance with an embodiment of the invention.

At operation S32, when the second command is not input within a predetermined time, the controller 22 can restart the erasing operation. With reference to FIGS. 3, 4, and 9, when the first command D0h is input, the controller 22 can set the ready/busy signal RY/BY to a low level and the suspend signal Susz to a low level. Accordingly, the controller 22 can restart the erasing operation. At this time, the address Add between the commands 60h and D0h can become disabled, and the address latch circuit 28 can output the storing address being stored as the internal address Aiz. Therefore, the erasing operation can be restarted continuously from the block of the internal address at a point where the erasing operation had been performed before the temporary suspension.

With reference to FIG. 5, when the erasing operation is terminated, a command 70h can be input, and the status of the erasing operation can be read out. With reference to FIG. 4, the erasing operation can be terminated (operation S36).

According to an embodiment, as in FIGS. 3 and 4, when the first command D0h is input as in operation S10, the erase control circuit 20 can start the erasing operation of the memory cells MC in a part of the region (for example, a few blocks) of the memory cell array 10 as in operation S12. Then, when the second command FFh is input, it can be decided whether to temporarily suspend the erasing operation (operation S18) or to reset the erasing operation (operation S38). If the temporary suspension is decided, the erasing operation can be temporarily suspended as in operation S18. If the reset is decided, the erasing operation can be terminated as in operation S36. Because the erase control circuit 20 can use the second command FFh as the command to temporarily suspend or to reset the erasing operation, the temporary suspension of the erasing operation can be performed without adding a command. The reset command and the suspend command can be the commands that are also accepted when the ready/busy signal RY/BY is at a low level (busy state). Therefore, by allocating the reset and the temporary suspension to the same second command in an embodiment, the control may be simplified rather than allocating the temporary suspension to a command that does not accept it at the busy state.

After the first command D0h is input, the decision circuit 24 of the erase control circuit 20 can decide to reset the erasing operation when the second command FFh is input before a predetermined time has passed as in operation S14. Meanwhile, the decision circuit 24 can decide to temporarily suspend the erasing operation, when the second command FFh is input after a predetermined time has passed as in operation S16. Accordingly, the decision circuit 24 can easily decide whether to temporarily suspend or to reset the erasing operation.

After temporarily suspending the erasing operation as in operation S18, the erase control circuit 20 can restart the erasing operation as in operation S34, if the first command D0h is input as in operation S30. Accordingly, because the erasing operation can be restarted using the first command D0h, the erasing operation can be restarted without adding a command.

When the erase control circuit 20 temporarily suspends the erasing operation as in operation S20, the address latch circuit 28 (memory unit) can store, as the storing address, the internal address Aiz of the memory cell array 10, which can perform the next erasing operation. When the erasing operation is restarted at operation S34, the storing address is output as the internal address Aiz, which can restart the erasing operation. Accordingly, the erasing operation can be restarted from the address at a point of the temporary suspension, because the address latch circuit 28 can store the address when the erasing operation is temporarily suspended, and the stored address can be used when the erasing operation is restarted.

After the erase control circuit 20 temporarily suspends the erasing operation, the erase control circuit 20 can terminate the erasing operation as in operation S36, if the second command FFh is input before a predetermined time has passed as in operation S22. This enables suspension of the erasing operation even when the erasing operation has been temporarily suspended. The second command FFh may be disabled, when the second command FFh is input while the erasing operation is temporarily suspended.

If it is "No" at operation S22, the second command FFh cannot be accepted from then on. In other words, the erase control circuit 20 can disable the second command FFh, when the second command FFh is input after a predetermined time has passed, after the temporary suspension of the erasing operation. Because there is no need to temporarily suspend the erasing operation again when the erasing operation has already been temporarily suspended, it may be desirable to disable the second command FFh, even when the second command FFh is input.

In an embodiment, the decoding of the command of the command recorder circuit 30 can be switched between the main command recorder circuit 30a and the sub-command recorder circuit 30b, depending on the switching signal Swhz that can be output by the controller 22. Accordingly, the second command FFh may be recognized as the reset command or the suspend command. In this manner, by forming the command recorder circuit 30 in a hierarchical structure, a plurality of operations can be performed using one command without adding a command. FIG. 2 is an example of a two-layered hierarchical structure in accordance with an embodiment of the invention. However, a hierarchical structure of three layers or more may be used in accordance with an embodiment of the invention.

According to one embodiment, the NAND-type memory cell array 10 can be used for the memory cell array 10. However, the NOR-type memory cell array may be used for the memory cell array 10 in accordance with an embodiment of the invention. The NAND-type memory cell array can collectively erase the memory cells within the memory cell array 10 in a unit of a block. Therefore, a demand for temporarily suspending the erasing operation during the erasing operation can be strong, and it can be effective to apply in accordance with an embodiment of the invention. In one embodiment, the address Add can be used as the address of the plurality of blocks. However, in an embodiment, an address of a unit including a plurality of memory cells may be used.

It is noted that the erasing operation of the memory cells has been used to explain the first operation in accordance with an embodiment of the invention. However, the first operation may be a writing operation to the memory cells in accordance with an embodiment of the invention. The first operation may be a reading operation from the memory cells in accordance with an embodiment of the invention.

It is noted that the various embodiments of the invention described herein are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 10:
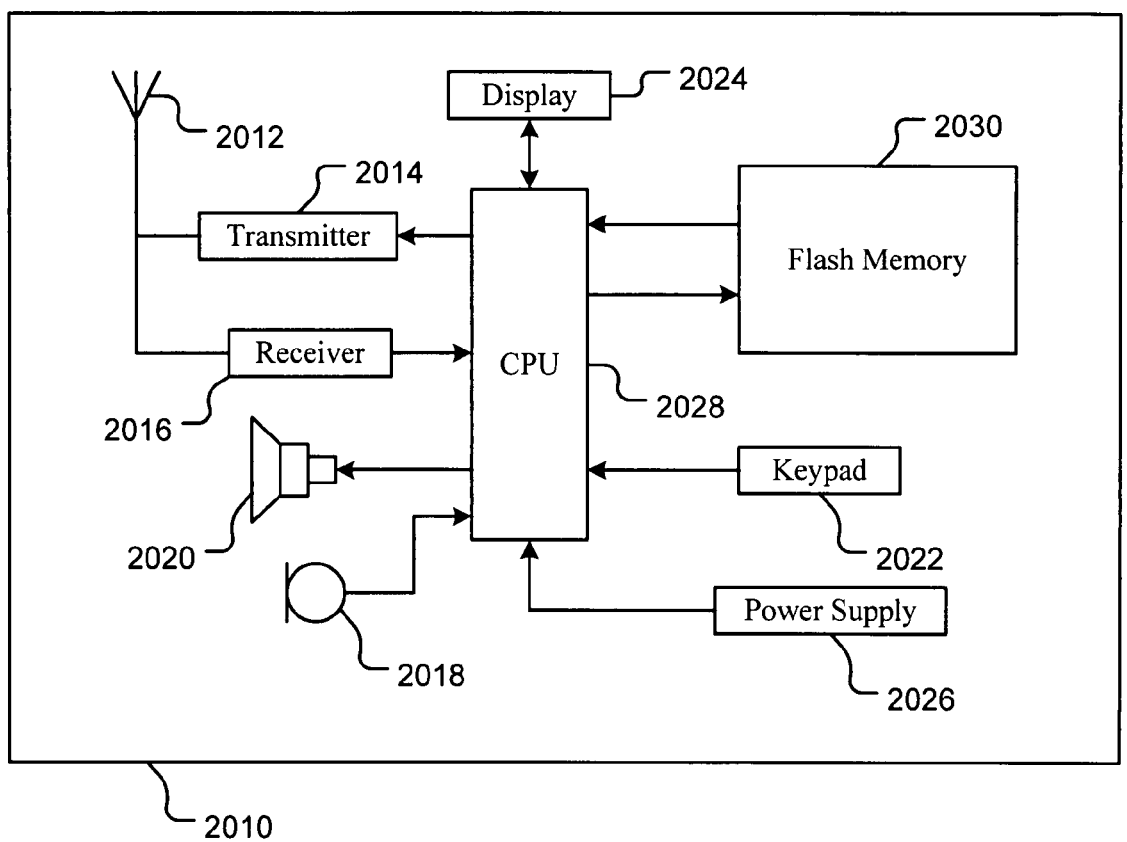
FIG. 10 illustrates a block diagram of an exemplary portable phone, upon which various embodiments of the invention may be implemented.

FIG. 10 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 can include, but is not limited to, an antenna 2012 coupled to a transmitter 2014 and a receiver 2016, as well as a microphone 2018, a speaker 2020, a keypad 2022, and a display 2024. The cell phone 2010 can also include, but is not limited to, a power supply 2026 and a central processing unit (CPU) 2028, which may be an embedded controller, conventional microprocessor, or the like. In addition, the cell phone 2010 can include integrated, flash memory 2030. Flash memory 2030 can be implemented in a wide variety of ways. For example, flash memory 2030 can be implemented in any manner similar to that described herein, but is not limited to such. For example in an embodiment, flash memory 2030 can be implemented in a manner similar to flash memory 100 of FIG. 1, but is not limited to such. An embodiment of the invention also provides a method of manufacturing flash memory 2030. In various embodiments, the flash memory 2030 can be utilized with various devices, such as mobile phones, cellular phones, internet protocol phones, and/or wireless phones.

Flash memory 2030 can be implemented in two primary varieties, NOR-type flash and NAND-type flash. While the general memory storage transistor can be the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory 2030 is applicable to a variety of devices other than portable phones. For instance, flash memory 2030 can be utilized in personal digital assistants, set-top boxes, digital video recorders, networking and telecommunication equipments, printers, computer peripherals, automotive navigation devices, and gaming systems, but is not limited to such.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 11:
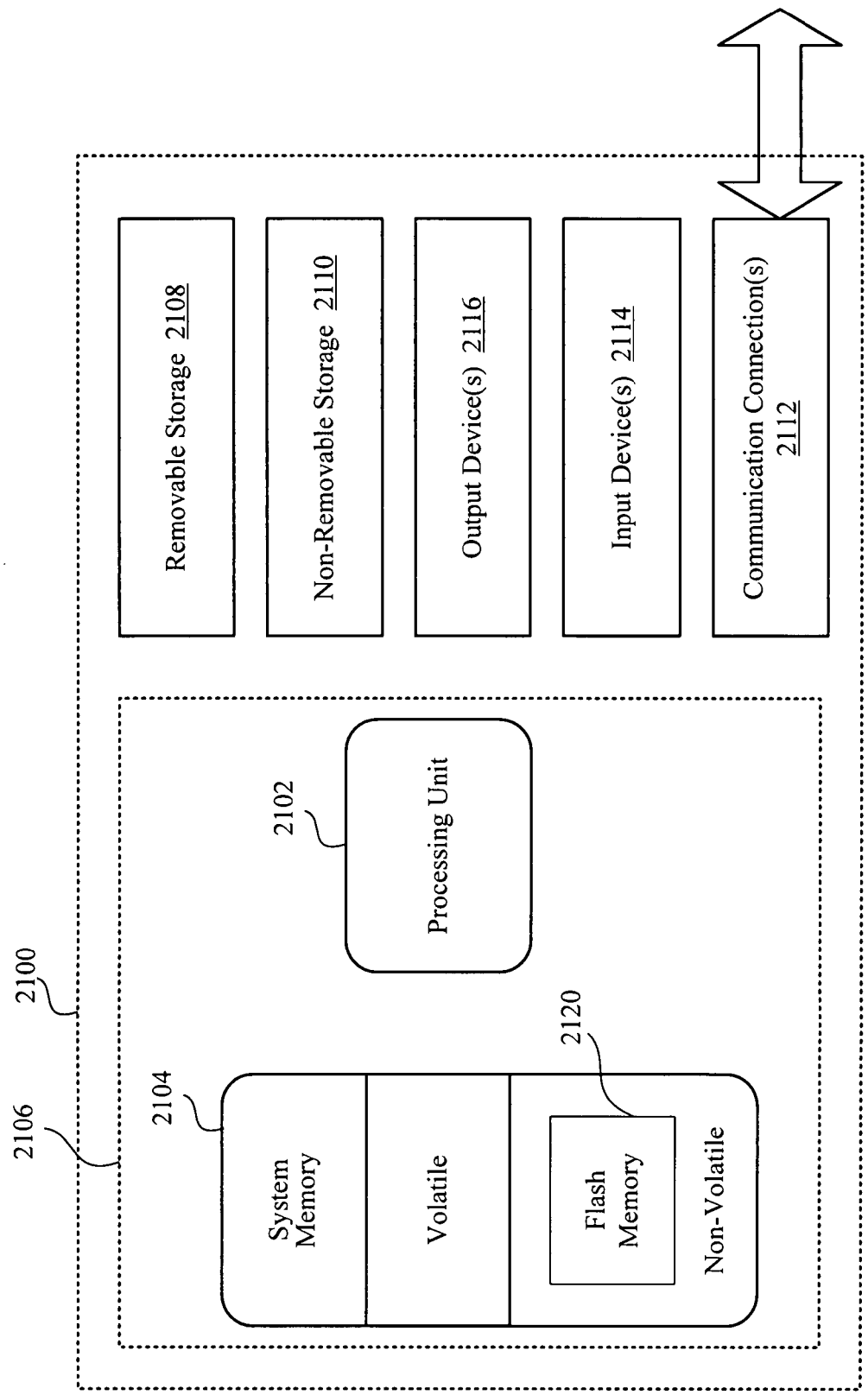
FIG. 11 illustrates a block diagram of an exemplary computing device, upon which various embodiments of the invention may be implemented.

FIG. 11 illustrates a block diagram of an exemplary computing device 2100, upon which various embodiments of the invention can be implemented. Although computing device 2100 is shown and described in FIG. 11 as having certain numbers and types of elements, the embodiments are not necessarily limited to the exemplary implementation. That is, computing device 2100 can include elements other than those shown, and can include more elements than the elements that are shown. For example, computing device 2100 can include a greater number of processing units than the one (processing unit 2102) shown. In an embodiment, computing device 2100 can include additional components not shown in FIG. 11.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory 2120 is especially useful with small-form-factor computing devices such as PDAs and portable gaming devices. Flash memory 2120 offers several advantages. In one example, flash memory 2120 is able to offer fast read access times while at the same time being able to withstand shocks and bumps better than standard hard disks. This can be desirable as small computing devices are often moved around and encounter frequent physical impacts. Also, flash memory 2120 is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory 2120, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 11 by removable storage 2108 and non-removable storage 2110.

Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 can be implemented in a wide variety of ways. For example, flash memory 2120 can be implemented in any manner similar to that described herein, but is not limited to such. For example in an embodiment, flash memory 2120 can be implemented in a manner similar to flash memory 100 of FIG. 1, but is not limited to such. An embodiment of the invention also provides a method of manufacturing flash memory 2120. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 12:
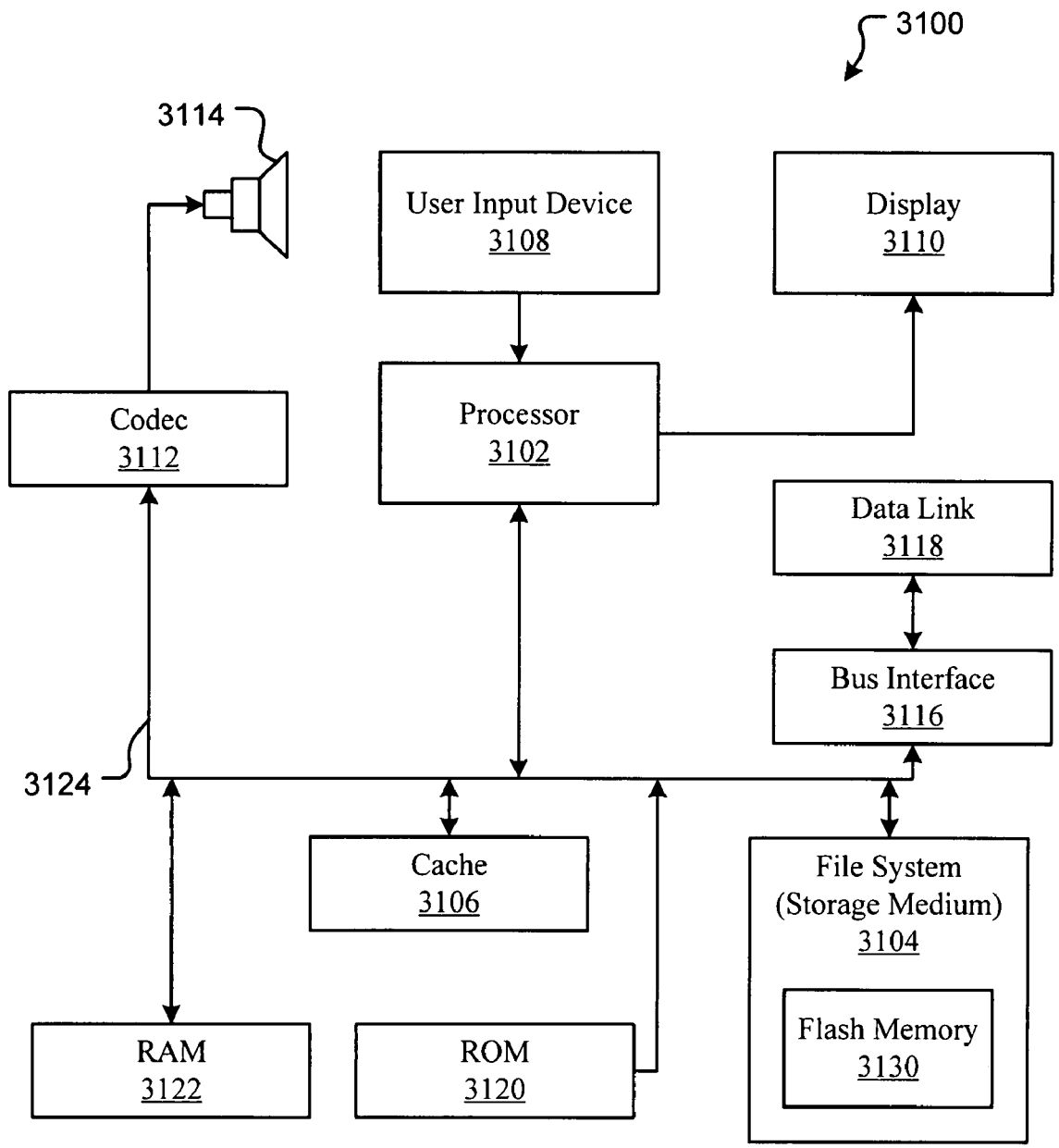
FIG. 12 illustrates an exemplary portable multimedia device, or media player, in accordance with various embodiments of the invention.

FIG. 12 shows an exemplary portable multimedia device, or media player, 3100 in accordance with an embodiment of the invention. The media player 3100 can include a processor 3102 that pertains to a microprocessor or controller for controlling the overall operation of the media player 3100. The media player 3100 can store media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 can include flash memory 3130. In the present embodiment, the flash memory 3130 can be implemented in a wide variety of ways. For example, flash memory 3130 can be implemented in any manner similar to that described herein, but is not limited to such. For example in an embodiment, flash memory 3130 can be implemented in a manner similar to flash memory 100 of FIG. 1, but is not limited to such. An embodiment of the invention also provides a method of manufacturing flash memory 3130. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

In various embodiments in accordance with the invention, it is noted that any mention of "couple", "coupled", and/or "coupling" may include direct and/or indirect connection between elements.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A semiconductor device comprising:
   a memory cell array including a plurality of nonvolatile memory cells; and
   a control circuit coupled to the memory cell array, the control circuit for starting a first operation of the memory cell array when a first command is input, the control circuit for deciding whether to temporarily suspend the first operation or to reset the first operation when a second command is input, the control circuit for temporarily suspending the first operation and for resetting the first operation, wherein the control circuit for deciding to reset the first operation when the second command is input before a predetermined time has passed.

2. The semiconductor device of claim 1, wherein the control circuit for deciding to temporarily suspend the first operation when the second command is input after the predetermined time has passed.

3. The semiconductor device of claim 1, wherein the control circuit for restarting the first operation when the first command is input after the first operation is temporarily suspended.

4. The semiconductor device of claim 3, further comprising:
a memory unit for storing, as a storing address, an internal address of the memory cell array that performs the next first operation when the control circuit temporarily suspends the first operation, and for outputting the storing address as the internal address to restart the first operation.

5. The semiconductor device of claim 2, wherein the control circuit for terminating the first operation when the second command is input before a predetermined time has passed after the first operation is temporarily suspended.

6. The semiconductor device of claim 5, wherein the control circuit for disabling the second command when the second command is input after the predetermined time has passed after the first operation is temporarily suspended.

7. The semiconductor device according to claim 1, wherein the memory cell array is a NAND-type memory cell array.

8. A method for a semiconductor device that includes a memory cell array having a plurality of nonvolatile memory cells, the method comprising:
starting a first operation of the memory cell array when a first command is input; and
when a second command is input thereafter, deciding whether to temporarily suspend the first operation or to reset the first operation, wherein the deciding whether to temporarily suspend the first operation when the second command is input after a predetermined time has passed.

9. The method of claim 8, wherein the deciding to reset the first operation when the second command is input before the predetermined time has passed.

10. The method of claim 8, wherein the memory cell array comprises a NAND-type memory cell array.

11. The method of claim 8, wherein the memory cell array is a NOR-type memory cell array.

12. The method of claim 8, wherein the memory cell array comprises a flash memory.

13. A wireless communications device, comprising:
a processor;
a communications component coupled to the processor;
a transmitter coupled to the processor;
a receiver;
an antenna coupled to the transmitter circuit and the receiver circuit; and
a memory coupled to the processor, the memory comprising:
a memory cell array including a plurality of nonvolatile memory cells; and
a control circuit coupled to the memory cell array, the control circuit for starting a first operation of the memory cell array when a first command is input, the control circuit for deciding whether to temporarily suspend the first operation or to reset the first operation when a second command is input, the control circuit for temporarily suspending the first operation and for resetting the first operation, wherein the control circuit for deciding to reset the first operation when the second command is input before a predetermined time has passed.

14. The wireless communications device of claim 13, wherein said memory cell array is NAND flash memory.

15. The wireless communications device of claim 13, wherein said memory cell array is NOR flash memory.

16. The wireless communications device of claim 13, wherein the control circuit for deciding to temporarily, suspend the first operation when the second command is input after the predetermined time has passed.

17. The wireless communications device of claim 13, wherein the control circuit for restarting the first operation when the first command is input after the first operation is temporarily suspended.

18. The semiconductor device according to claim 1, wherein the memory cell array is a NOR-type memory cell array.

19. The semiconductor device according to claim 1, wherein the memory cell array comprises a flash memory.

* * * * *